United States Patent
Ishii

(10) Patent No.: US 7,956,698 B2
(45) Date of Patent: Jun. 7, 2011

(54) HIGH-FREQUENCY VOLTAGE-CONTROLLED OSCILLATION CIRCUIT

(75) Inventor: Takehito Ishii, Sayama (JP)

(73) Assignee: Nihon Dempa Kogyo Co., Ltd, Tokyo (JP)

(*) Notice: Subject to any disclaimer, the term of this patent is extended or adjusted under 35 U.S.C. 154(b) by 0 days.

(21) Appl. No.: 12/585,092

(22) Filed: Sep. 3, 2009

(65) Prior Publication Data

US 2010/0001805 A1   Jan. 7, 2010

Related U.S. Application Data

(63) Continuation of application No. PCT/JP2008/053173, filed on Feb. 25, 2008.

(30) Foreign Application Priority Data

Mar. 6, 2007 (JP) .............. P. 2007-055892
Mar. 19, 2007 (JP) .............. P. 2007-071516

(51) Int. Cl.
  *H03B 5/08* (2006.01)
  *H03B 5/12* (2006.01)
  *H03B 5/18* (2006.01)

(52) U.S. Cl. ............ 331/167; 331/117 R; 331/117 D; 331/177 V

(58) Field of Classification Search .......... 331/36 C, 331/117 R, 117 FE, 117 D, 167, 177 V
See application file for complete search history.

(56) References Cited

U.S. PATENT DOCUMENTS 5,550,545 A * 8/1996 Rydel .................. 341/176
2005/0242896 A1  11/2005 Rohde et al.

FOREIGN PATENT DOCUMENTS

| JP | 60-139330 | 9/1985 |
|----|-----------|--------|
| JP | 01-132118 | 9/1989 |
| JP | 02-261209 | 10/1990 |
| JP | 06-132726 | 5/1994 |
| JP | 06-196928 | 7/1994 |
| JP | 09-200077 | 7/1997 |
| JP | 11-154824 | 6/1999 |
| JP | 11-308050 | 11/1999 |
| JP | 2000-228602 | 8/2000 |
| JP | 2002-171130 | 6/2002 |
| JP | 2003-101344 | 4/2003 |
| JP | 2005-086366 | 3/2005 |
| JP | 2005-311770 | 4/2005 |
| JP | 2006-279158 | 10/2006 |

OTHER PUBLICATIONS

Japanese Office Action and translation dated Apr. 28, 2009.

* cited by examiner

*Primary Examiner* — David Mis
(74) *Attorney, Agent, or Firm* — Jacobson Holman PLLC

(57) ABSTRACT

A high-frequency voltage-Controlled oscillation circuit which does not oscillate abnormally, is improved in phase noise, and has a small circuit scale. A phase shift circuit composed of third or more order odd π low-Pass filter and capacitive variable-reactance elements (D1, D2) connected to the input and output of the low-pass filter in series respectively is inserted in a feedback loop of a transistor of an oscillation amplifier circuit. The low-pass filter is composed of an inductive reactance element (L3) connected to the feedback loop in series and capacitive variable-reactance elements (D4, D5) parallel connected to the input and Output of the inductive reactance element (L3). The inductive reactance element (L3) is a C-Shaped, a donut-Shaped, or a U-Shaped microstrip line. Thus, a high-frequency voltage-Controlled oscillation circuit is realized.

15 Claims, 26 Drawing Sheets

FIG.3

| HARMONIC ORDER | HARMONIC LEVEL (dBc) | |
|---|---|---|
| | PRIOR ART | PRESENT INVENTION |
| SECOND | −12.0 | −16.2 |
| THIRD | −13.8 | −34.4 |
| FOURTH | −15.5 | −23.3 |
| FIFTH | 2.2 | −19.1 |
| SIXTH | −8.4 | −39.2 |
| SEVENTH | −19.0 | −30.1 |
| EIGHTH | −42.2 | −38.2 |
| NINTH | −37.3 | −40.2 |
| TOTAL DISTORTION RATE (%) | 140 | 21 |

FIG.7

| HARMONIC ORDER | HARMONIC LEVEL (dBc) | |
|---|---|---|
| | PRIOR ART | PRESENT INVENTION |
| SECOND | -12.0 | -6.2 |
| THIRD | -13.8 | -27.0 |
| FOURTH | -15.5 | -29.0 |
| FIFTH | 2.2 | -32.3 |
| SIXTH | -8.4 | -22.0 |
| SEVENTH | -19.0 | -28.4 |
| EIGHTH | -42.2 | -37.4 |
| NINTH | -37.3 | -45.3 |
| TOTAL DISTORTION RATE (%) | 140 | 50 |

FIG.10

|  | HARMONIC LEVEL (dBc) | |
| --- | --- | --- |
| HARMONIC ORDER | PRIOR ART | PRESENT INVENTION |
|  |  |  |
|  |  |  |
| SECOND | -12.0 | -16.4 |
| THIRD | -13.8 | -15.6 |
| FOURTH | -15.5 | -28.8 |
| FIFTH | 2.2 | -24.1 |
| SIXTH | -8.4 | -18.8 |
| SEVENTH | -19.0 | -32.7 |
| EIGHTH | -42.2 | -36.2 |
| NINTH | -37.3 | -32.3 |
| TOTAL DISTORTION RATE (%) | 140 | 26 |

FIG.26
(PRIOR ART)

| HARMONIC ORDER | HARMONIC LEVEL (dBc) |
|---|---:|
|  |  |
| SECOND | -12.0 |
| THIRD | -13.8 |
| FOURTH | -15.5 |
| FIFTH | 2.2 |
| SIXTH | -8.4 |
| SEVENTH | -19.0 |
| EIGHTH | -42.2 |
| NINTH | -37.3 |
| TOTAL DISTORTION RATE (%) | 140 |

HIGH-FREQUENCY VOLTAGE-CONTROLLED OSCILLATION CIRCUIT

This is a Continuation of PCT/JP2008/053173 filed Feb. 25, 2008 and published in Japanese, which has a priority of Japanese no. 2007-55892 filed Mar. 6, 2007 and Japanese no. 2007-71516filed Mar. 19, 2007, hereby incorporated by reference.

BACKGROUND OF THE INVENTION

1. Field of the Invention

The present invention relates to a high-frequency voltage-controlled oscillation circuit, and more particularly, to a high-frequency voltage-controlled oscillation circuit which restrains abnormal oscillations and improves phase noise.

2. Description of the Related Art

A conventional high-frequency voltage-controlled oscillation circuit has been composed of an oscillating amplifier circuit and a phase shifting circuit formed of inductive reactance elements and a capacitive variable reactance element, the phase shifting circuit being formed by connecting the capacitive variable reactance element in series to a third-order π variable high-pass filter.

The conventional high-frequency voltage-controlled oscillation circuit will be described with reference to FIG. 23. FIG. 23 is a diagram illustrating a simplified circuit of the conventional high-frequency voltage-controlled oscillation circuit.

As illustrated in FIG. 23, in the conventional high-frequency voltage-controlled oscillation circuit, the collector and the base of a transistor Q of the oscillating amplifier circuit are connected by a feedback loop, variable-capacitance diodes D2, D3, and D1 are connected in series to the feedback loop, a point between the diode D1 and the diode D3 is connected to one end of a coil L1, which is an inductive reactance element, while the other end thereof is grounded, and a point between the diode D2 and the diode D3 is connected to one end of a coil L2, which is an inductive reactance element, while the other end thereof is grounded.

Here, the diode D3 and the coils L1 and L2 constitute the third-order π variable high-pass filter (HPF: High Pass Filter).

FIG. 24 illustrates the frequency characteristic of an oscillation loop gain of the conventional circuit. FIG. 24 is a diagram illustrating the frequency characteristic of the oscillation loop gain in the conventional high-frequency voltage-controlled oscillation circuit. In FIG. 24, the axis of abscissas indicates frequency and the axis of ordinates indicates gain.

The oscillating frequency in FIG. 24 is set to 700 MHz. Hence, if the phase shifting circuit has a high-pass filter, then an oscillation loop gain may become 0 dB or more at a frequency of 700 MHz or more, leading to a possibility of the occurrence of an unintended oscillation at a frequency of the oscillating frequency.

Further, an oscillation spectrum in an oscillation loop in the case where a prior art is used will be described with reference to FIG. 25 and the levels of harmonics will be described with reference to FIG. 26. FIG. 25 is a diagram illustrating the oscillation spectrum in a conventional oscillation loop, and FIG. 26 is a diagram illustrating the levels of the harmonics.

In FIG. 25, "1" on the axis of abscissas denotes a desired oscillating frequency and "2" and the subsequent numerals denote the orders of high-order harmonics. Referring to FIG. 25 and FIG. 26, it can be confirmed that there is a high-order harmonic level close to the desired oscillating frequency.

The levels of the harmonics are obtained by calculating the deviations from a reference wave (first-order). Further, the distortion rate of each order (=100*10^(deviation/20)) is calculated and the distortion rates of the second-order up to the ninth-order are totalized to obtain the total distortion (%).

Related prior arts have been disclosed in US Patent Application Laid-Open No. US2005/0242896A1 (Patent Document 1), Japanese Patent Application Laid-Open No. 11-154824 (Patent Document 2), Japanese Patent Application Laid-Open No. 2006-279158 (Patent Document 3), Japanese Patent Application Laid-Open No. 2000-228602 (Patent Document 4), Japanese Patent Application Laid-Open No. 2005-086366 (Patent Document 5), Japanese Patent Application Laid-Open No. 06-196928 (Patent Document 6), Japanese Patent Application Laid-Open No. 11-308050 (Patent Document 7), Japanese Patent Application Laid-Open No. 2002-171130 (Patent Document 8), and Japanese Patent Application Laid-Open No. 2003-101344 (Patent Document 9).

Patent Document 1 discloses a specific circuit configuration in FIG. 2 therein. Simplifying this circuit diagram provides one illustrating a circuit having a similar configuration illustrated in FIG. 23. The diodes D1, D2, and D3 and the coils L1 and L2 in FIG. 23 correspond to diodes D3, D2, and D4 to D7, coils TL1 and TL3, and coils TL2 and TL4, respectively, in FIG. 2 of Patent Document 1.

Patent Document 2 discloses that, in a temperature-compensated oscillator, temperature changes in an I/O feedback inductive reactance circuit is compensated for by using a temperature compensating capacitor in an output capacitive reactance circuit of an amplifying element.

Patent Document 3 discloses an amplitude modulator in which a low-pass filter is constituted of inductors L1, L2, and L3, a capacitor C2, and a variable-capacitance diode VD.

Patent Document 4 discloses a resonant line in which a plurality of micro-strip lines is set to a length which causes the reactance between one end of each of a plurality of micro-strip lines and the ground to become equivalently inductive, and the ends thereof are interconnected.

Patent Document 5 discloses a broadband high frequency power amplifier circuit in which a micro-strip line is used as a series impedance function inductance, and the series impedance function inductance is formed into a U-shape pattern.

Patent Document 6 discloses a voltage-controlled oscillation circuit in which a C/N characteristic compensating impedance is formed of a parallel resonance circuit 11 of an inductive element L and a capacitive element C12, and the impedance at a resonance frequency of the parallel resonance circuit is used as a line impedance.

Patent Document 7 discloses a voltage-controlled piezoelectric oscillator in which an amplifier, a piezoelectric vibrator, an expander coil, and a variable-capacitance diode are connected in series, the expander coil being composed of at least two coils.

Patent Document 8 discloses a voltage-controlled oscillation circuit in which a bias resistor R3, which defines a DC bias current, is connected to the emitter of an oscillating transistor, and an impedance control circuit 23 formed of a capacitance component C7 and inductor components L2 and L3 is disposed between the bias resistor R3 and the ground.

Patent Document 9 discloses a frequency shifting high-frequency voltage-controlled oscillation circuit in which the anode of a variable-capacitance diode Dv of a resonance circuit is connected to a ground potential, and a shifting circuit S1 composed of a shifting strip line SL5 and a switching diode Di1 which is connected in parallel to the shifting strip line SL5, a shifting voltage being applied to one end of the switching diode Di1, is disposed in multiple stages between the anode and the ground.

Patent Document 1: US Patent Application Laid-Open No. US2005/0242896A1
Patent Document 2: Japanese Patent Application Laid-Open No. 11-154824
Patent Document 3: Japanese Patent Application Laid-Open No. 2006-279158
Patent Document 4: Japanese Patent Application Laid-Open No. 2000-228602
Patent Document 5: Japanese Patent Application Laid-Open No. 2005-086366
Patent Document 6: Japanese Patent Application Laid-Open No. 06-196928
Patent Document 7: Japanese Patent Application Laid-Open No. 11-308050
Patent Document 8: Japanese Patent Application Laid-Open No. 2002-171130
Patent Document 9: Japanese Patent Application Laid-Open No. 2003-101344

SUMMARY OF THE INVENTION

However, in the conventional high-frequency voltage-controlled oscillation circuit described above, if the phase shifting circuit has a high-pass filter, then the gain of the oscillation loop will be maintained at 1 or more even at a frequency that is higher than an oscillating frequency. Hence, the reactance of a parasitic component attributable to a floating capacitance or the like of the circuit becomes unignorable at the oscillating frequency or more, undesirably satisfying an oscillation phase condition at an unintended high frequency. This has been presenting a problem of an abnormal oscillation at an unintended frequency of the oscillating frequency or more.

Further, the high-pass filter of the phase shifting circuit leads to relatively high levels of high-order harmonics in the oscillation loop, and noise components produced by mixing high-order harmonics are added to a signal of the oscillating frequency. This has been causing a problem of worsened phase noise.

The present invention has been made with a view of the aforesaid circumstances, and it is an object of the invention to provide a high-frequency voltage-controlled oscillation circuit capable of restraining an abnormal oscillation, improving a phase noise, and reducing a circuit size.

To solve the problems with the conventional example described above, a high-frequency voltage-controlled oscillation circuit in accordance with the present invention comprises an oscillating amplifier circuit, wherein a feedback loop of the oscillating amplifier circuit includes a phase shifting circuit having an odd number of $\pi$ low-pass filter or filters of a third order or more, a first diode of a capacitive variable reactance element connected in series with an output end of the low-pass filter, and a second diode of a capacitive variable reactance element connected in series with the input end of the low-pass filter, and the low-pass filter includes a coil of an inductive reactance element connected in series with the feedback loop, a fourth diode of the capacitive variable reactance element connected in parallel with the output end of the inductive reactance element, and a fifth diode of the capacitive variable reactance element connected in parallel to the input end of the inductive reactance element. Therefore, it is possible to provide a characteristic like that of a band-pass filter by controlling the capacitance of the capacitive variable reactance element, restrain abnormal oscillations, improve phase noise, and permit easy adjustment using a simple configuration.

According to the present invention, in the high-frequency voltage-controlled oscillation circuit, a varicap is used for the capacitive variable reactance element in the phase shifting circuit.

According to the present invention, in the high-frequency voltage-controlled oscillation circuit, a varicap is used for the capacitive variable reactance element in the low-pass filter.

According to the present invention, in the high-frequency voltage-controlled oscillation circuit, the inductive reactance element in the low-pass filter is formed of a micro-strip line. This arrangement advantageously allows the size of the product to be reduced without worsening phase noise.

Further, a high-frequency voltage-controlled oscillation circuit in accordance with the present invention comprises an oscillating amplifier circuit, wherein a phase shifting circuit is provided in a feedback loop for feeding an output back to an input of the oscillating amplifier circuit, the phase shifting circuit includes a first diode serving as a capacitive variable reactance element connected in series with an output end of the feedback loop, a second diode serving as a capacitive variable reactance element connected in series with an input end of the feedback loop, a third diode serving as a capacitive variable reactance element connected in series with the feedback loop between the first diode and the second diode, and a double-tuned circuit having a first parallel resonance circuit provided in a feedback loop connecting the first diode and the third diode, and a second parallel resonance circuit provided in a feedback loop connecting the second diode and the third diode, the first parallel resonance circuit has a fourth diode serving as a capacitive variable reactance element and a first coil serving as an inductive reactance element, and the second parallel resonance circuit has a fifth diode serving as a capacitive variable reactance element and a second coil serving as an inductive reactance element. Therefore, it is possible to provide a characteristic like that of a variable band-pass filter by controlling the capacitances of the capacitive variable reactance elements, restrain abnormal oscillations, improve phase noises, and permit easy adjustment using a simple configuration.

According to the present invention, in the high-frequency voltage-controlled oscillation circuit, wherein a first capacitor serving as a capacitive reactance element is connected in series between a first diode serving as a capacitive reactance element connected in series to an output end of the double-tuned circuit and a third diode serving as a capacitive variable reactance element in the double-tuned circuit, and a second capacitor serving as a capacitive reactance element is connected in series between a third diode serving as a capacitive variable reactance element in the double-tuned circuit and a second diode serving as a capacitive reactance element connected in series with an input end of the double-tuned circuit, while a first coil serving as an inductive reactance element is connected with one end of the first capacitor, a second coil serving as an inductive reactance element is connected with one end of the second capacitor, and a fourth diode serving as a capacitive variable reactance element is connected with the other end of the first capacitor, and a fifth diode serving as a capacitive variable reactance element is connected with the other end of the second capacitor.

According to the present invention, in the high-frequency voltage-controlled oscillation circuit, the inductive reactance elements in the double-tuned circuit are formed of micro-strip lines. Therefore, it is possible to allow good phase noise to be obtained.

According to the present invention, in the high-frequency voltage-controlled oscillation circuit, the micro-strip lines have a horseshoe shape, a donut shape, or a U shape bent at 45 degrees. Therefore, it is possible to achieve a further reduced size of the product without causing worsened phase noise.

BRIEF DESCRIPTION OF THE DRAWINGS

FIG. 3 It is a diagram showing the levels of harmonics of the first circuit.

FIG. 7 It is a diagram showing the levels of harmonics of the second circuit.

FIG. 10 It is a diagram showing the levels of harmonics of the third circuit.

FIG. 26 It is a diagram illustrating the levels of harmonics.

DESCRIPTION OF REFERENCE NUMERALS

Figure 1:
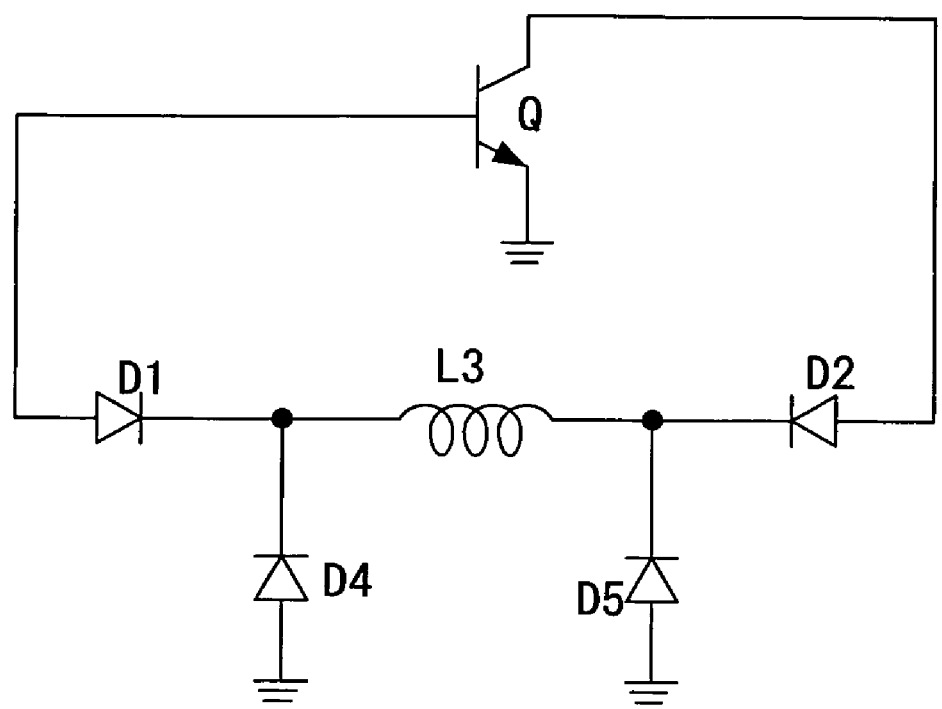
FIG. 1 It is a configuration diagram illustrating a simplified circuit of a high-frequency voltage-controlled oscillation circuit according to a first embodiment of the present invention.

1 Oscillating amplifier circuit
2 Buffer amplifier circuit
3 Output matching section
4 Inductive reactance element
5 Capacitive variable reactance element
6 Capacitive variable reactance element
7 Capacitive variable reactance element
8 Capacitive variable reactance element
9 Inductive reactance element
10 Inductive reactance element
11 Capacitive reactance element
12 Capacitive reactance element
14 Capacitive variable reactance element

DESCRIPTION OF THE PREFERRED EMBODIMENT

Overview of Embodiments

Embodiments of the present invention will be described with reference to the accompanying drawings.

In a high-frequency voltage-controlled oscillation circuit in accordance with the present invention, a feedback loop of an oscillating amplifier circuit includes a phase shifting circuit having an odd number of π low-pass filter of filters of a third order or more and capacitive variable reactance elements connected in series with an input end and an output end of the low-pass filter, and the low-pass filter includes an inductive reactance element connected in series with the feedback loop, and a capacitive variable reactance element connected in parallel to an input end and an output end of the inductive reactance element. The arrangement implements a circuit which makes it possible to select a frequency to be used by controlling the capacitances of the capacitive variable reactance elements of the low-pass filter and also to attenuate the gain of a low frequency by controlling the capacitances of the capacitive variable reactance elements connected in series with the feedback loop so as to provide a characteristic similar to that of a band-pass filter, to restrain abnormal oscillations, to improve phase noise, and to permit easier adjustment by a simple configuration.

In the high-frequency voltage-controlled oscillation circuit according to an embodiment of the present invention, a feedback loop of the oscillating amplifier circuit includes a phase shifting circuit which has a double-tuned circuit having a plurality of parallel resonance circuits of capacitive variable reactance elements and inductive reactance elements, and capacitive variable reactance elements connected in series with the input end and the output end of the double-tuned circuit, and the double-tuned circuit connects the plurality of parallel resonance circuits by capacitive variable reactance elements. This arrangement makes it possible to select a frequency to be used by controlling the capacitances of the capacitive variable reactance elements of the double-tuned circuit and also to attenuate the gain of a frequency other than an oscillating frequency by controlling the capacitances of the capacitive variable reactance elements connected in series with the feedback loop so as to provide a characteristic of a band-pass filter, to restrain abnormal oscillations, and to improve phase noise.

Further, according to the high-frequency voltage-controlled oscillation circuit in accordance with an embodiment of the present invention, the inductive reactance elements are constituted of the micro-strip lines having a horseshoe shape, a donut shape, or a U shape bent at 45 degrees in the high-frequency voltage-controlled oscillation circuit, thus permitting a reduced product size and better phase noise.

Main Points of Embodiments

A first main point of the embodiments of the present invention is that an oscillation condition is not allowed to be satisfied at frequencies other than a target oscillating frequency, and a second main point is that the oscillation loop gain at a frequency of an oscillating frequency or more is lowered thereby to reduce a high-order harmonic produced on the oscillation loop, thus reducing the amount of noise added to a desired oscillating frequency.

The aforesaid second main point may be implemented by providing the phase shifting circuit with a low-pass filter. However, in order to also implement the first main point, the phase shifting circuit has to be provided with a band-pass filter.

However, a standard band-pass filter inevitably includes more elements, as compared with a low-pass filter, and the tuning thereof is difficult. For this reason, the phase shifting circuit in the embodiments of the present invention includes a band-pass filter composed of a third-order π variable low-pass filter and capacitive variable reactance elements connected in series to the input end and the output end of the low-pass filter. This arrangement makes it possible to achieve a reduced number of elements, lower cost and a reduced size, as compared with a standard band-pass filter.

Figure 23:
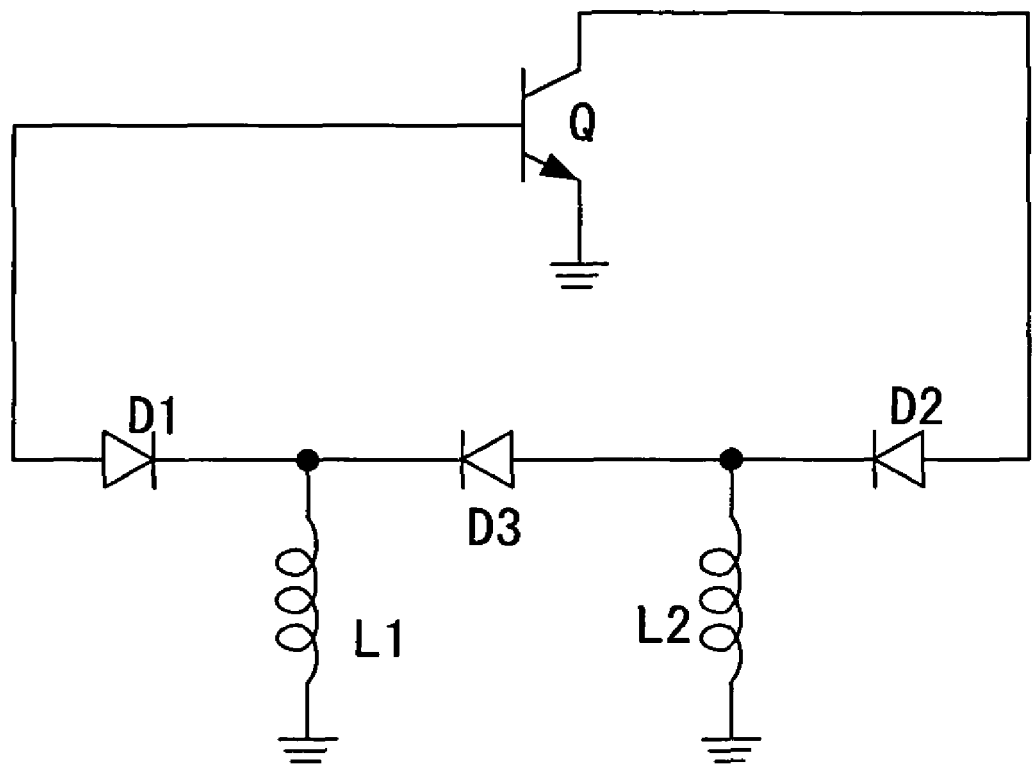
FIG. 23 It is a diagram illustrating a simplified circuit of a conventional high-frequency voltage-controlled oscillation circuit.
Figure 24:
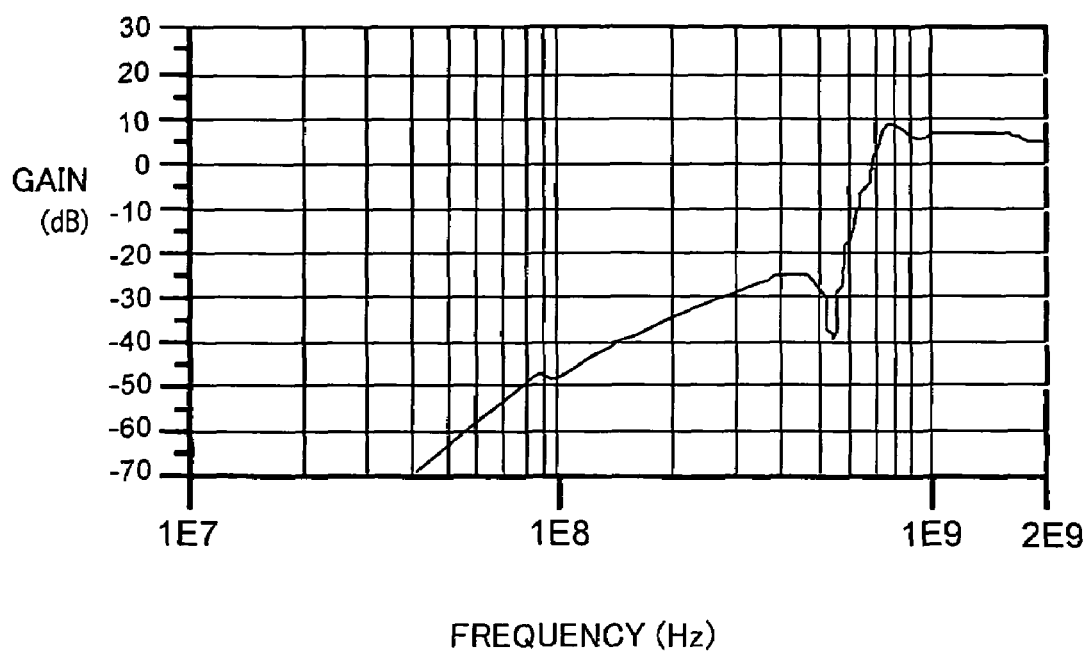
FIG. 24 It is a diagram illustrating a frequency characteristic of an oscillation loop gain in the conventional high-frequency voltage-controlled oscillation circuit.
Figure 25:
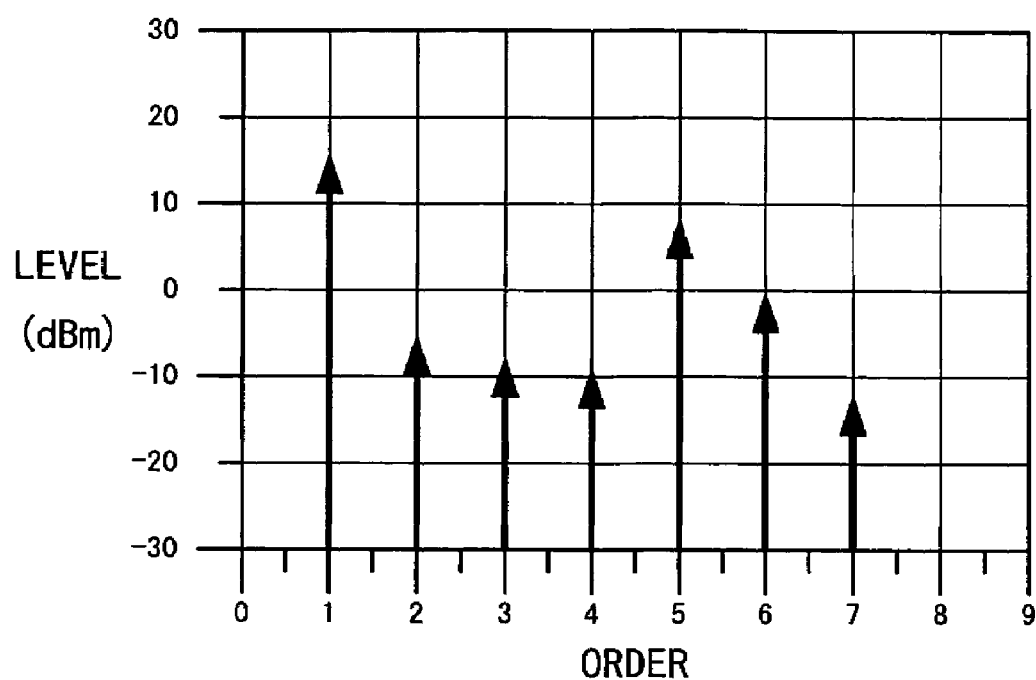
FIG. 25 It is a diagram illustrating an oscillation spectrum in a conventional oscillation loop.

Further, a third-order π high-pass filter requires two inductive reactance elements (coils L1 and L2 in FIG. 23). In addition, in order to increase the Q of the elements, two transmission lines formed on a board have been applied in an actual product, thus presenting a problem of restrictions on reducing the size of the product.

Preferably, in the phase shifting circuit according to the embodiments of the present invention, a π variable low-pass filter is used and micro-strip lines formed on a mounting board, for example, are applied for the inductive reactance elements in the filter as the transmission lines from the aspects of the Q of elements, cost, and variations. This makes it possible to decrease the two transmission lines of the conventional product to one transmission line, permitting a reduced size of the product.

Further, in order to reduce the manufacturing variations in oscillating frequencies, the band-pass filter according to the embodiments of the present invention employs the double-tuned circuit which connects the LC parallel resonances by capacitances rather than employing Butterworth or Chebyshev filters, which are generally used (which alternately connect a series resonance and a parallel resonance of an LC).

The plurality of capacitive variable reactance elements constituting the double-tuned circuit sets the coupling amount of LC tuning circuits to an appropriate amount, and the capacitive variable reactance elements connected in series to the input end and the output end of the double-tuned circuit set the coupling amount of the oscillating amplifier and a double-tuned circuit to an appropriate amount, thereby preventing phase noise at a desired oscillating frequency from worsening.

Further, in the phase shifting circuit according to the embodiments of the present invention, preferably, the inductive reactance elements of the double-tuned circuits are inductive reactance elements disposed between signal lines and a grounding wire (GND wire), and micro-strip lines formed on a mounting board, for example, are applied as the transmission paths from the aspect of the element Q, cost, and variations.

Further, micro-strip lines linearly laid out, shaped like a donut or shaped like U bent at 45 degrees do not cause a marked change in the phase noise. Therefore, applying micro-strip lines formed in the donut shape or the U shape bent at 45 degrees, which occupies a less space on a mounting board, permit a reduced size and lower cost of the product.

[Simplified Configuration of the Circuit: FIG. 1]

Referring to FIG. 1, a high-frequency voltage-controlled oscillation circuit according to a first embodiment of the present invention will be described. FIG. 1 is a configuration diagram illustrating a simplified circuit of the high-frequency voltage-controlled oscillation circuit according to the first embodiment of the present invention.

The high-frequency voltage-controlled oscillation circuit according to the first embodiment of the present invention (a first circuit) is basically constituted of a transistor Q of an oscillating amplifier circuit, a third-order π variable low-pass filter, and capacitive variable reactance elements connected in series with the input end and the output end of the low-pass filter, as illustrated in FIG. 1.

The third-order π low-pass filter and the capacitive variable reactance elements connected in series with the input end and the output end of the low-pass filter implement a variable band-pass filter characteristic.

The transistor Q of the oscillating amplifier circuit connects the collector and the base thereof by a feedback loop.

The third-order π variable low-pass filter is provided in the feedback loop, and a coil L3, which is the inductive reactance element connected in series, and diodes D4 and D5, which are the capacitive variable reactance elements, are connected in parallel to both ends of the coil L3.

The cathode ends of the diodes D4 and D5 are connected to both ends of the coil L3, while the anode ends of the diodes D4 and D5 are grounded.

In FIG. 1, the third-order π variable low-pass filter is used as the low-pass filter. Alternatively, however, the low-pass filter may be a π variable low-pass filter of an odd-numbered order of the third order or more.

A diode D1, which is a capacitive variable reactance element, is connected in series between the base of the transistor Q and the low-pass filter.

The anode end of the diode D1 is connected to the base of the transistor Q and the cathode end thereof is connected to the low-pass filter.

A diode D2, which is a capacitive variable reactance element, is connected in series between the collector of the transistor Q and the low-pass filter.

The anode end of the diode D2 is connected to the collector of the transistor Q and the cathode end thereof is connected to the low-pass filter.

Thus, the phase shifting circuit has the band-pass filter, so that the oscillation loop gain reaches 0 dB or more only at a frequency in the vicinity of an oscillating frequency, and there is no possibility of unintended oscillation taking place at a frequency of the oscillating frequency or less or more.

Figure 2:
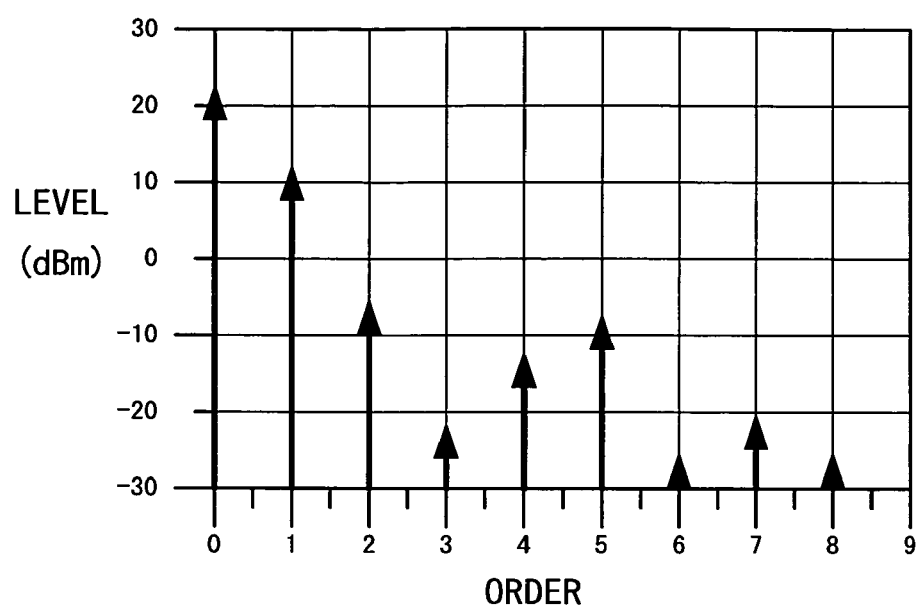
FIG. 2 It is a diagram illustrating an oscillation spectrum in an oscillation loop of a first circuit.

[Oscillation Spectrum: FIG. 2; Spectrum Level: FIG. 3]

The oscillation spectrum in the first circuit is illustrated in FIG. 2, and the levels of the oscillation spectrum are illustrated in comparison with conventional ones (FIG. 26) in FIG. 3. FIG. 2 is a diagram illustrating the oscillation spectrum in the oscillation loop of the first circuit, and FIG. 3 is a diagram illustrating the levels of the harmonics of the first circuit.

In FIG. 2, "1" on the axis of abscissas denotes a desired oscillating frequency and "2" and the subsequent numerals denote the orders of high-order harmonics. From FIG. 2 and FIG. 3, the comparison with the prior art reveals that the first circuit obviously shows lower high-order harmonics and that the distortion rate has been improved from 140% (prior art) to 21%.

This makes it difficult for noise components, which are produced by mixing high-order harmonics, to be added to the signals of oscillating frequencies, thus permitting a better phase noise characteristic.

Figure 4:
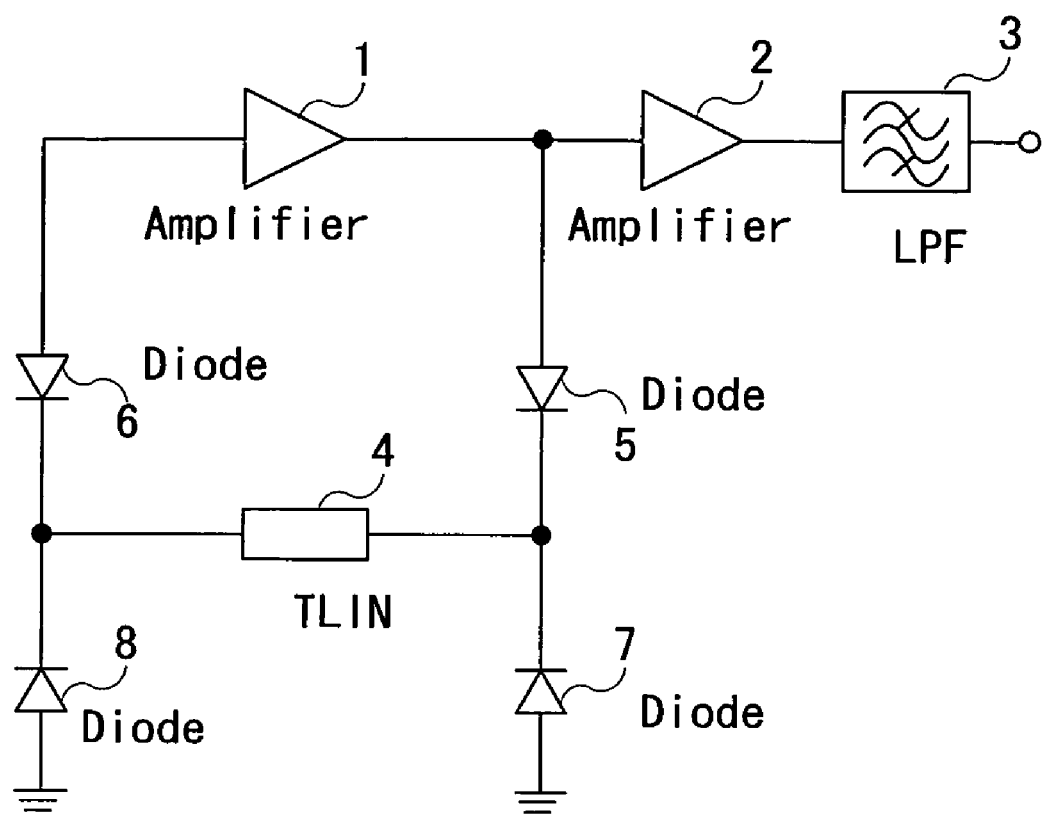
FIG. 4 It is a configuration diagram of a specific circuit of the first circuit.

[Specific Circuit: FIG. 4]

A specific circuit of the first circuit will now be described with reference to FIG. 4. FIG. 4 is a configuration diagram of the specific circuit of the first circuit.

As illustrated in FIG. 4, the specific circuit of the first circuit includes an oscillating amplifier circuit (Amplifier) 1, a buffer amplifier circuit (Amplifier) 2, an output matching section (LPF) 3, an inductive reactance element (TLIN) 4 provided in the middle of a feedback loop for feeding an output of the oscillating amplifier circuit 1 back to an input thereof, a capacitive variable reactance element 5 provided between an output end of the oscillating amplifier circuit 1 and an input end of the inductive reactance element 4 in the feedback loop, a capacitive variable reactance element 6 provided between an output end of the inductive reactance element 4 and an input end of the oscillating amplifier circuit 1 in the feedback loop, and capacitive variable reactance elements 7 and 8 provided at both ends, namely, the input end and the output end, respectively, of the inductive reactance element 4.

The output matching section 3 is composed of a low-pass filter.

The capacitive variable reactance elements 5 to 8 are composed of varicap diodes.

The anode of the diode of the capacitive variable reactance element 5 is connected to the output end of the oscillating amplifier circuit 1, while the cathode thereof is connected to the input end of the inductive reactance element 4.

The anode of the diode of the capacitive variable reactance element 6 is connected to the input end of the oscillating amplifier circuit 1, while the cathode thereof is connected to the output end of the inductive reactance element 4.

The anodes of the diodes of the capacitive variable reactance elements 7 and 8 are grounded, while the cathodes thereof are connected to the input end and the output end of the inductive reactance element 4.

The inductive reactance element 4 and the capacitive variable reactance elements 7 and 8 constitute a third-order π variable low-pass filter. The low-pass filter and the capacitive variable reactance elements 5 and 6 constitute a phase shifting circuit.

A frequency to be used can be arbitrarily selected (a peak can be freely selected (set)) by controlling the capacitance of the varicap diodes of the capacitive variable reactance elements 7 and 8. Further, the gain at a low frequency can be attenuated by controlling the capacitance of the varicap diodes of the capacitive variable reactance elements 5 and 6. This permits an adjustment to improve a phase noise characteristic.

Further, the inductive reactance element 4 is formed of micro-strip lines, which are especially formed to have a horseshoe shape, a donut shape, or a U shape bent at 45 degrees. This allows the size of a module to be reduced without causing phase noise to be worsened.

Figure 5:
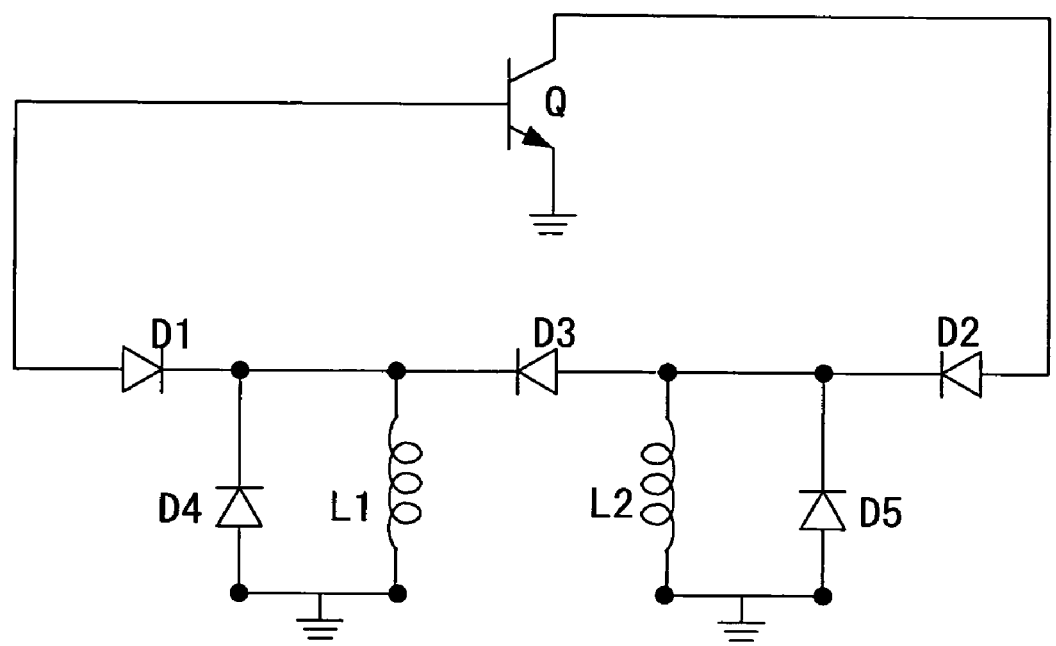
FIG. 5 It is a configuration diagram illustrating a simplified circuit of a high-frequency voltage-controlled oscillation circuit according to a second embodiment of the present invention.

[Simplified Configuration of the Second Circuit: FIG. 5]

A high-frequency voltage-controlled oscillation circuit according to a second embodiment of the present invention will now be described with reference to FIG. 5. FIG. 5 is a configuration diagram illustrating a simplified circuit of the high-frequency voltage-controlled oscillation circuit according to the second embodiment of the present invention.

The high-frequency voltage-controlled oscillation circuit (the second circuit) according to the second embodiment of the present invention is basically constituted of a transistor Q of an oscillating amplifier circuit, a double-tuned circuit, and capacitive variable reactance elements connected in series with an input end and an output end of the double-tuned, as illustrated in FIG. 5.

The double-tuned circuit and the capacitive variable reactance elements connected in series thereto constitute a phase shifting circuit.

The second circuit uses the capacitive variable reactance elements to connect the oscillating amplifier circuit and the double-tuned circuits thereby to adjust a coupling amount.

The transistor Q of the oscillating amplifier circuit has its collector and base connected by a feedback loop.

The double-tuned circuit is provided in the middle of the feedback loop and has a diode D3, which is a capacitive variable reactance element, connected in series, and diodes D4 and D5, which are capacitive variable reactance elements, and coils L1 and L2, which are inductive reactance elements, connected in parallel to both ends of the diode D3.

The cathode ends of the diodes D4 and D5 are connected to both ends of the diode D3, while the anode ends of the diodes D4 and D5 are grounded.

Further, the ends on one side of the coils L1 and L2 are connected to both ends of the diode D3, while the ends on the other side of the coils L1 and L2 are grounded.

A diode D1, which is a capacitive variable reactance element, is connected in series between the base of the transistor Q and the output end of the double-tuned circuit.

The anode end of the diode D1 is connected to the base of the transistor Q and the cathode end thereof is connected to the output end of the double-tuned circuit.

A diode D2, which is a capacitive variable reactance element, is connected in series between the collector of the transistor Q and the input end of the double-tuned circuit.

The anode end of the diode D2 is connected to the collector of the transistor Q and the cathode end thereof is connected to the input end of the double-tuned circuit.

The frequency characteristic of the oscillation loop in the second circuit indicates a band-pass filter, the gain of which reaches a maximum at an oscillating frequency.

Thus, the phase shifting circuit has the band-pass filter, so that the oscillation loop gain reaches 0 dB or more only at a frequency in the vicinity of an oscillating frequency, leading to no possibility of unintended oscillation taking place at a frequency of the oscillating frequency or less or more.

Figure 6:
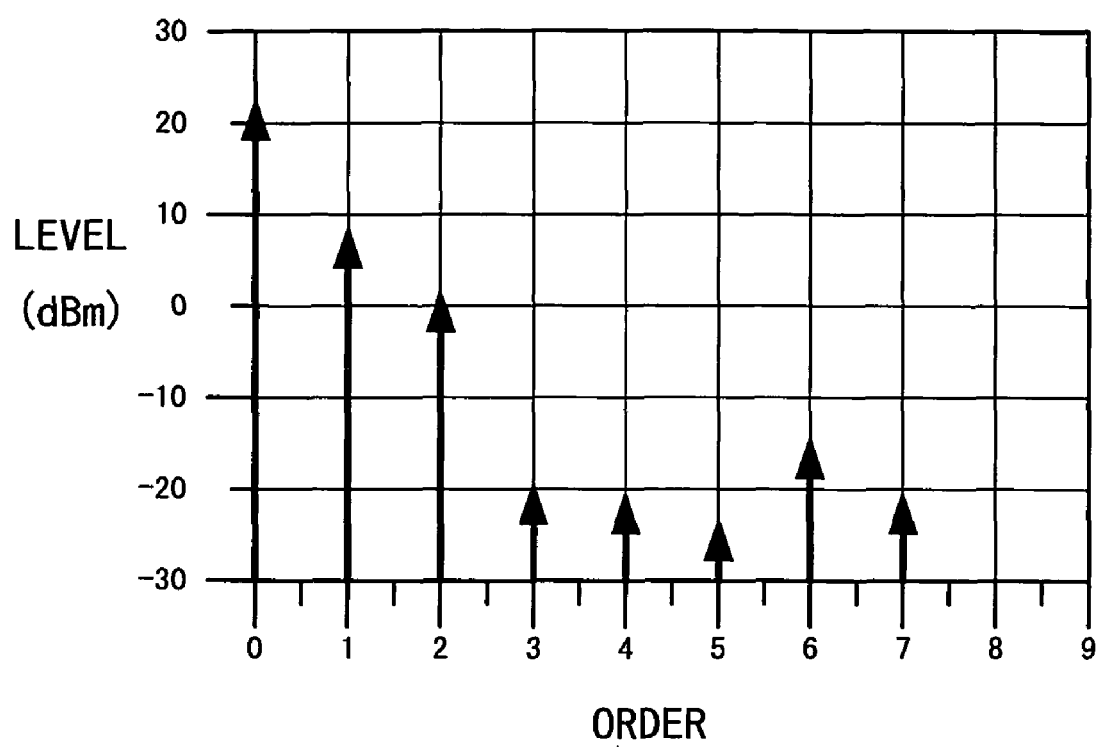
FIG. 6 It is a diagram illustrating an oscillation spectrum in an oscillation loop of a second circuit.

[Oscillation Spectrum: FIG. 6; Spectrum Level: FIG. 7]

The oscillation spectrum in the second circuit is illustrated in FIG. 6, and the levels of the oscillation spectrum are illustrated in comparison with conventional ones (FIG. 26) in FIG. 7. FIG. 6 is a diagram illustrating the oscillation spectrum in the oscillation loop of the second circuit, and FIG. 7 is a diagram illustrating the levels of the harmonics of the second circuit.

In FIG. 6, "1" on the axis of abscissas denotes a desired oscillating frequency and "2" and the subsequent numerals denote the orders of high-order harmonics. From FIG. 6 and FIG. 7, the comparison with the prior art reveals that the second circuit obviously shows lower levels of high-order harmonics and that the distortion rate has been improved from 140% (prior art) to 50%.

Figure 8:
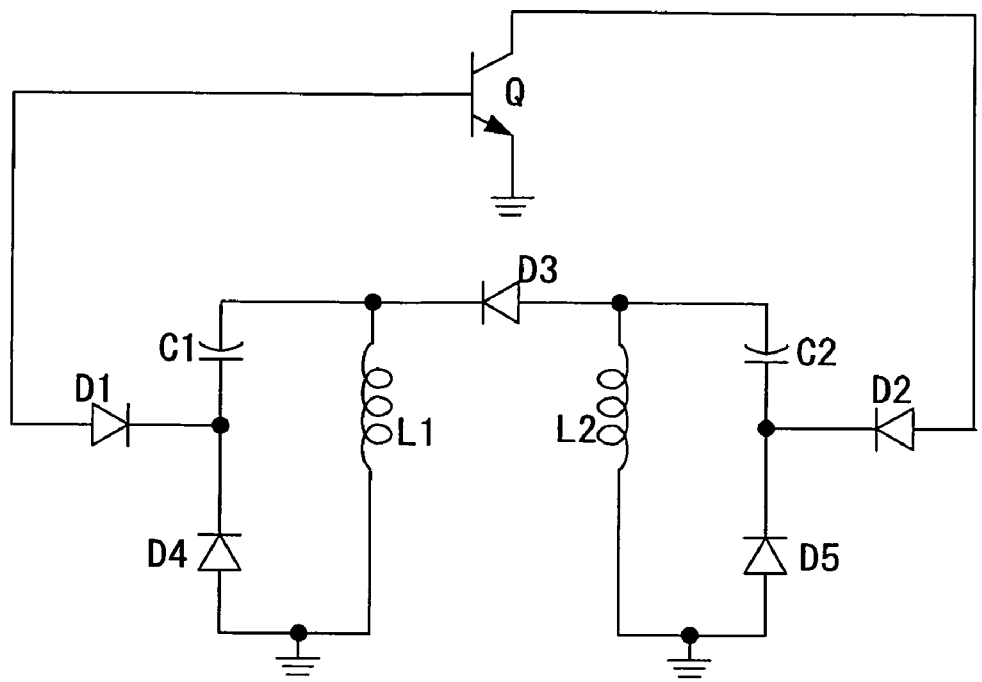
FIG. 8 It is a configuration diagram illustrating a simplified circuit of a high-frequency voltage-controlled oscillation circuit according to a third embodiment of the present invention.

This makes it difficult for noise components, which are produced by mixing high-order harmonics, to be added to the signals of oscillating frequencies, thus achieving a better phase noise characteristic than that obtained by the prior art.
[Simplified Configuration of a Third Circuit: FIG. 8]

A high-frequency voltage-controlled oscillation circuit according to a third embodiment of the present invention (a third circuit) will now be described with reference to FIG. 8. FIG. 8 is a configuration diagram illustrating a simplified circuit of the high-frequency voltage-controlled oscillation circuit according to the third embodiment of the present invention.

As illustrated in FIG. 8, the third circuit differs from the second circuit in the configuration of the double-tuned circuit.

A double-tuned circuit provided in the middle of a feedback loop and includes a capacitor C2 serving as a capacitive reactance element, a diode D3 serving as a capacitive variable reactance element, and a capacitor C1 serving as a capacitive reactance element, which are connected in series, coils L1 and L2 serving as inductive reactance elements, which are connected in parallel to both ends of the diode D3, a diode D4 serving as a capacitive variable reactance element connected between the capacitor C1 and the diode D1, and a diode D5 serving as a capacitive variable reactance element connected between the capacitor C2 and the diode D2.

The cathode end of the diode D4 is connected to a point between the capacitor C1 and the diode D1, while the anode end of the diode D4 is grounded.

Further, the cathode end of the diode D5 is connected to a point between the capacitor C2 and the diode D2, while the anode end of the diode D5 is grounded.

The ends on one side of the coils L1 and L2 are connected to both ends of the diode D3, while the ends on the other side of the coils L1 and L2 are grounded.

In the third circuit, an LC parallel resonance circuit and an oscillating amplifier circuit are connected by a capacitance tap of the LC parallel resonance circuit, thereby adjusting the amount of coupling with the oscillating amplifier circuit at an oscillating frequency.

The frequency characteristic of an oscillation loop gain in the third circuit indicates a band-pass filter, the gain of which reaches a maximum at an oscillating frequency.

Figure 9:
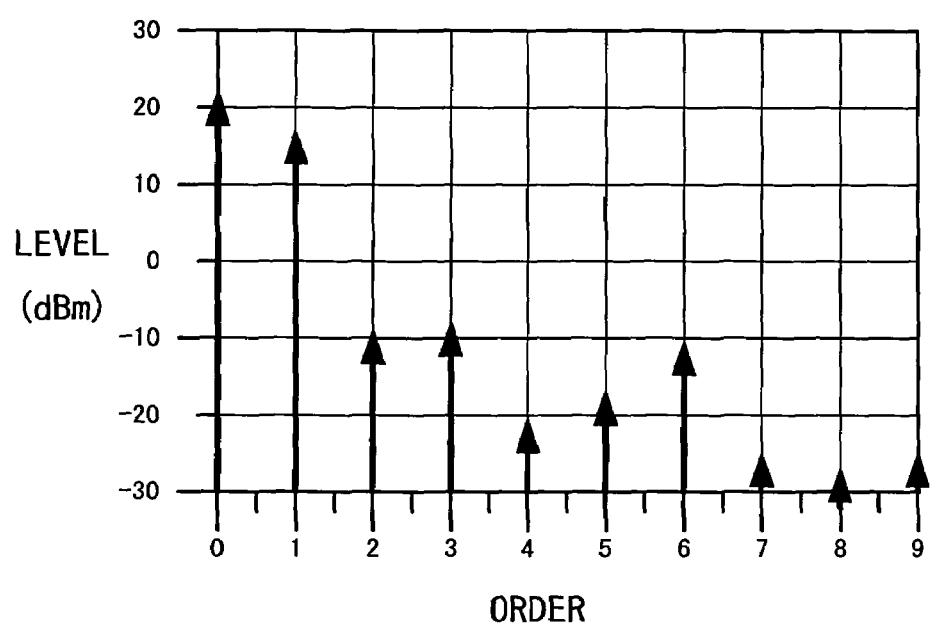
FIG. 9 It is a chart illustrating an oscillation spectrum in an oscillation loop of a third circuit.

Thus, a phase shifting circuit has the band-pass filter, so that the oscillation loop gain reaches 0 dB or more only in the vicinity of an oscillating frequency, leading to no possibility of unintended oscillation taking place at a frequency of the oscillating frequency or less or more.
[Oscillation Spectrum: FIG. 9; Spectrum Level: FIG. 10]

The oscillation spectrum in the third circuit is illustrated in FIG. 9, and the levels of the oscillation spectrum are illustrated in comparison with conventional ones (FIG. 26) in FIG. 10. FIG. 9 is a diagram illustrating the oscillation spectrum in the oscillation loop of the third circuit, and FIG. 10 is a diagram illustrating the levels of the harmonics of the third circuit.

In FIG. 9, "1" on the axis of abscissas denotes a desired oscillating frequency and "2" and the subsequent numerals denote the orders of high-order harmonics. From FIG. 9 and FIG. 10, the comparison with the prior art reveals that the third circuit obviously shows lower levels of high-order harmonics and that the distortion rate has been improved from 140% (prior art) to 26%.

Figure 11:
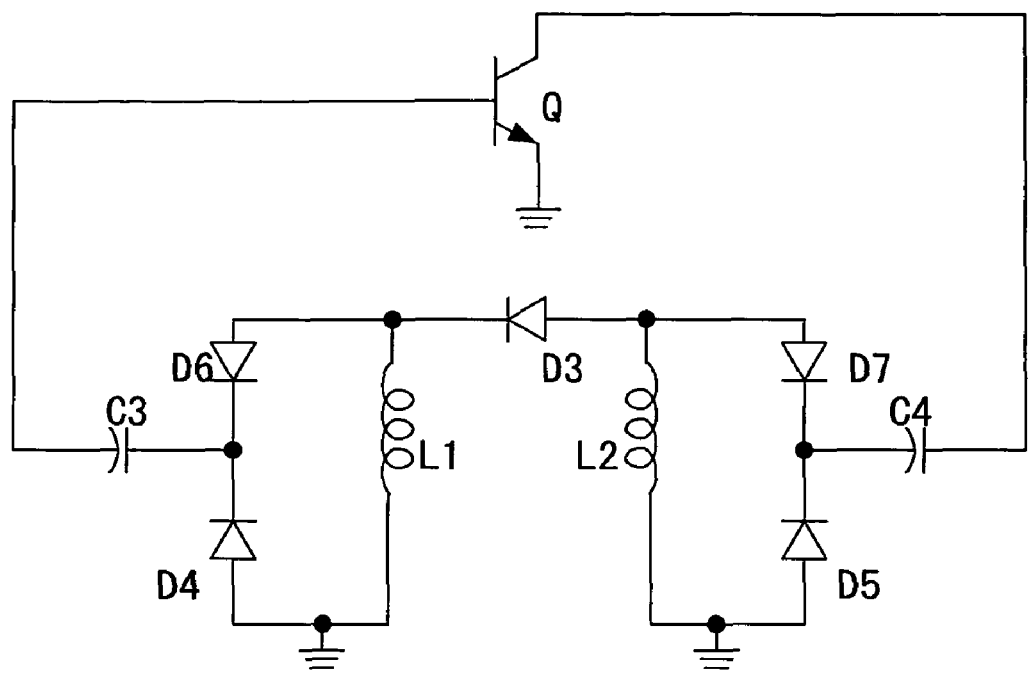
FIG. 11 It is a configuration diagram illustrating a simplified circuit of a high-frequency voltage-controlled oscillation circuit according to a fourth embodiment of the present invention.

This makes it difficult for noise components, which are produced by mixing high-order harmonics, to be added to the signals of oscillating frequencies, thus achieving a better phase noise characteristic than that obtained by the prior art.
[Fourth Circuit: FIG. 11]

A high-frequency voltage-controlled oscillation circuit according to a fourth embodiment of the present invention (a fourth circuit) will now be described with reference to FIG. 11. FIG. 11 is a configuration diagram illustrating a simplified circuit of the high-frequency voltage-controlled oscillation circuit according to the fourth embodiment of the present invention.

As illustrated in FIG. 11, the fourth circuit differs from the third circuit in the configuration of the double-tuned circuit and capacitors C3 and C4, which are capacitive reactance elements rather than the capacitive variable reactance elements, connected in series to the input and output ends of the double-tuned circuit.

In a double-tuned circuit provided in the middle of a feedback loop, a diode D7 serving as a capacitive variable reactance element, a diode D3 serving as a capacitive variable reactance element, and a diode D6 serving as a capacitive variable reactance element are connected in series, coils L1 and L2 serving as inductive reactance elements are connected in parallel to both ends of the diode D3, and a diode D4 serving as a capacitive variable reactance element is connected between the capacitor C3 and the diode D6, and a diode D5 serving as a capacitive variable reactance element is connected between the capacitor C4 and the diode D7.

The cathode end of the diode D4 is connected to a point between the capacitor C3 and the diode D6, while the anode end of the diode D4 is grounded.

Further, the cathode end of the diode D5 is connected to a point between the capacitor C4 and the diode D7, while the anode end of the diode D5 is grounded.

The ends on one side of the coils L1 and L2 are connected to both ends of the diode D3, while the ends on the other side of the coils L1 and L2 are grounded.

Figure 12:
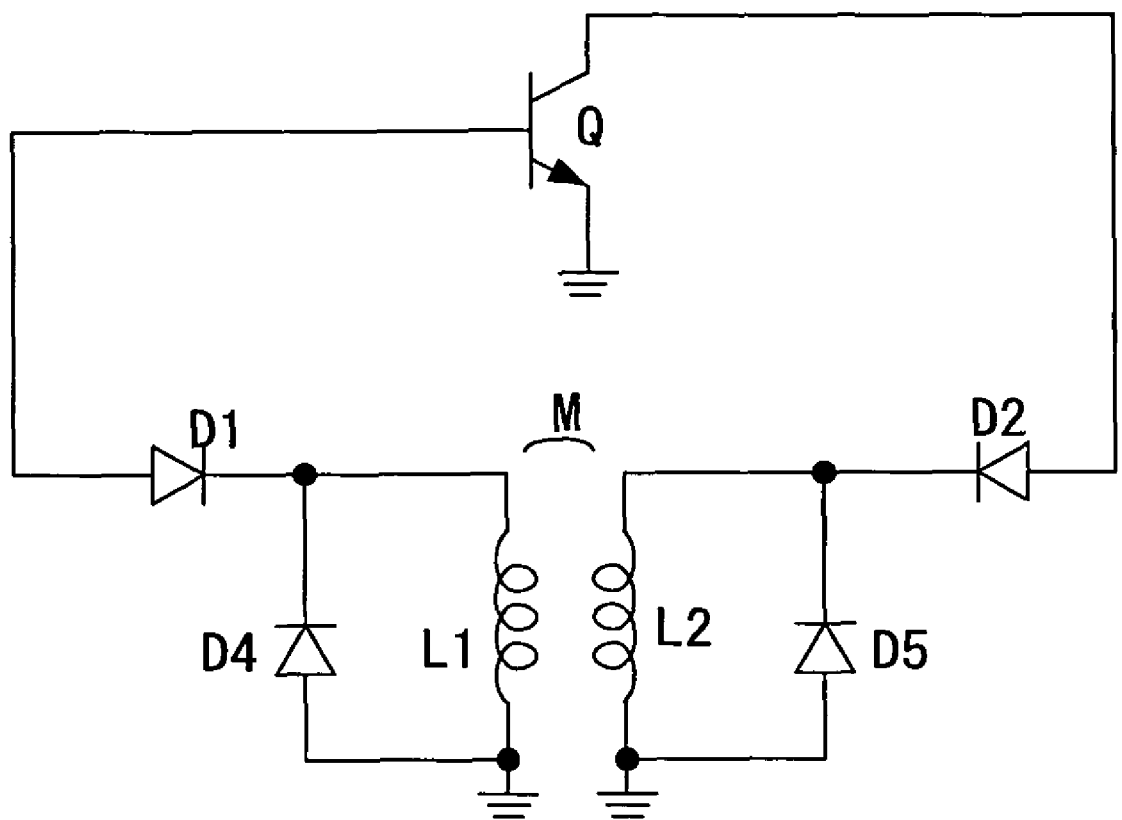
FIG. 12 It is a configuration diagram illustrating a simplified circuit of a high-frequency voltage-controlled oscillation circuit according to a fifth embodiment of the present invention.

The fourth circuit adjusts the capacitances of the diodes D4 to D7, which are capacitive variable reactance elements, thereby to provide a characteristic as a variable band-pass filter.
[Fifth Circuit: FIG. 12]

A high-frequency voltage-controlled oscillation circuit according to a fifth embodiment of the present invention (a fifth circuit) will now be described with reference to FIG. 12. FIG. 12 is a configuration diagram illustrating a simplified circuit of the high-frequency voltage-controlled oscillation circuit according to the fifth embodiment of the present invention.

As illustrated in FIG. 12, the fifth circuit differs from the second circuit in that the parallel resonance circuits are coupled using a magnetic field.

Figure 13:
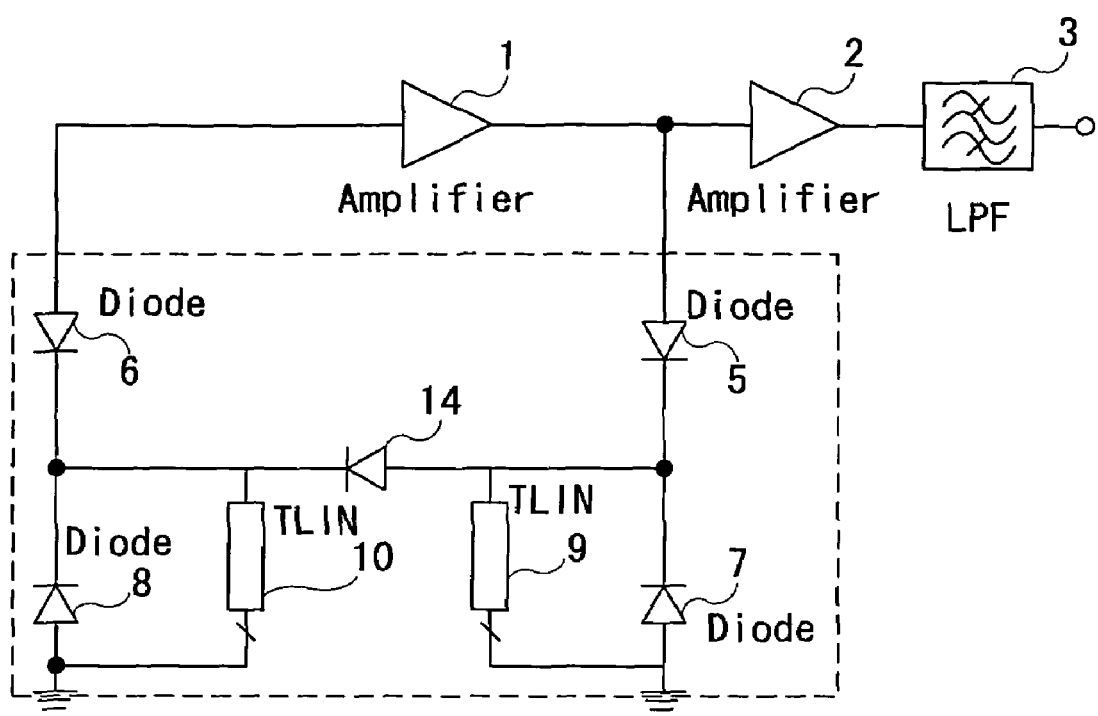
FIG. 13 It is a configuration diagram of a specific circuit of the second circuit.

Specifically, a double-tuned circuit in a phase shifting circuit has replaced the diode D4, which is the capacitive variable reactance element, by coils L1 and L2, which are inductive reactance elements. The coils L1 and L2 are disposed to oppose each other so as to provide connection by a magnetic field. The rest of the configuration is the same as that of the second circuit.
[Specific Second Circuit: FIG. 13]

Referring now to FIG. 13, a specific circuit of the second circuit will be described. FIG. 13 is a configuration diagram of the specific circuit of the second circuit.

As illustrated in FIG. 13, the specific circuit of the second circuit includes an oscillating amplifier circuit (Amplifier) 1, a buffer amplifier circuit (Amplifier) 2, an output matching section 3, an inductive reactance element 14 provided in the middle of a feedback loop for feeding an output of the oscillating amplifier circuit 1 to an input thereof, a capacitive variable reactance element 5 provided between the output end of the oscillating amplifier circuit 1 and the capacitive variable reactance element 14 in the feedback loop, a capacitive variable reactance element 6 provided between the capacitive variable reactance element 14 and the input end of the oscillating amplifier circuit 1 in the feedback loop, capacitive variable reactance elements 7 and 8 provided on both the input end and the output end of the capacitive variable reactance element 14, and inductive reactance elements 9 and 10 provided on both the input end and the output end of the capacitive variable reactance element 14.

The output matching section 3 is constituted of a low-pass filter (LPF).

The capacitive variable reactance elements 14 and 5 to 8 are constituted of varicap diodes.

The anode of the diode of the capacitive variable reactance element 5 is connected to the output end of the oscillating amplifier circuit 1, and the cathode thereof is connected to the capacitive variable reactance element 14.

The anode of the diode of the capacitive variable reactance element 6 is connected to the input end of the oscillating amplifier circuit 1, and the cathode thereof is connected to the capacitive variable reactance element 14.

The anodes of the diodes of the capacitive variable reactance elements 7 and 8 are grounded, while the cathodes thereof are connected to the input and output ends of the capacitive variable reactance element 14.

The inductive reactance element 9 has one end thereof connected to the anode end of the capacitive variable reactance element 14, the other end thereof being grounded.

The inductive reactance element 10 has one end thereof connected to the cathode end of the capacitive variable reactance element 14, the other end thereof being grounded.

Further, the capacitive variable reactance elements 14, 7, and 8 and the inductive reactance elements 9 and 10 constitute a double-tuned circuit, and the double-tuned circuit and the capacitive variable reactance elements 5 and 6 constitute a phase shifting circuit.

The capacitive variable reactance element 7 and the inductive reactance element 9 constitute a first LC parallel resonance circuit (a first LC tuned circuit), and the capacitive variable reactance element 8 and the inductive reactance element 10 constitute a second LC parallel resonance circuit (a second LC tuned circuit).

Further, the first tuned circuit and the second tuned circuit are connected by the capacitive variable reactance element 14.

The amount of coupling of the LC tuned circuits can be set to an appropriate value based on an oscillating frequency by controlling the capacitance of the varicap diode of the capacitive variable reactance element 14.

A frequency to be used can be arbitrarily selected by controlling the capacitance of the varicap diodes of the capacitive variable reactance elements 7 and 8. Further, controlling the capacitances of the varicap diodes of the capacitive variable reactance elements 5 and 6 makes it possible to obtain an appropriate amount of coupling of the oscillating amplifier circuit 1 and the double-tuned circuit and to attenuate the gain at a frequency other than an oscillating frequency. This permits an adjustment to improve a phase noise characteristic.

Further, the inductive reactance elements 9 and 10 are formed of micro-strip lines, which are especially formed to have a horseshoe shape, a donut shape, or a U shape bent at 45 degrees. This allows the size of a module to be reduced without causing phase noise to be worsened.

Figure 14:
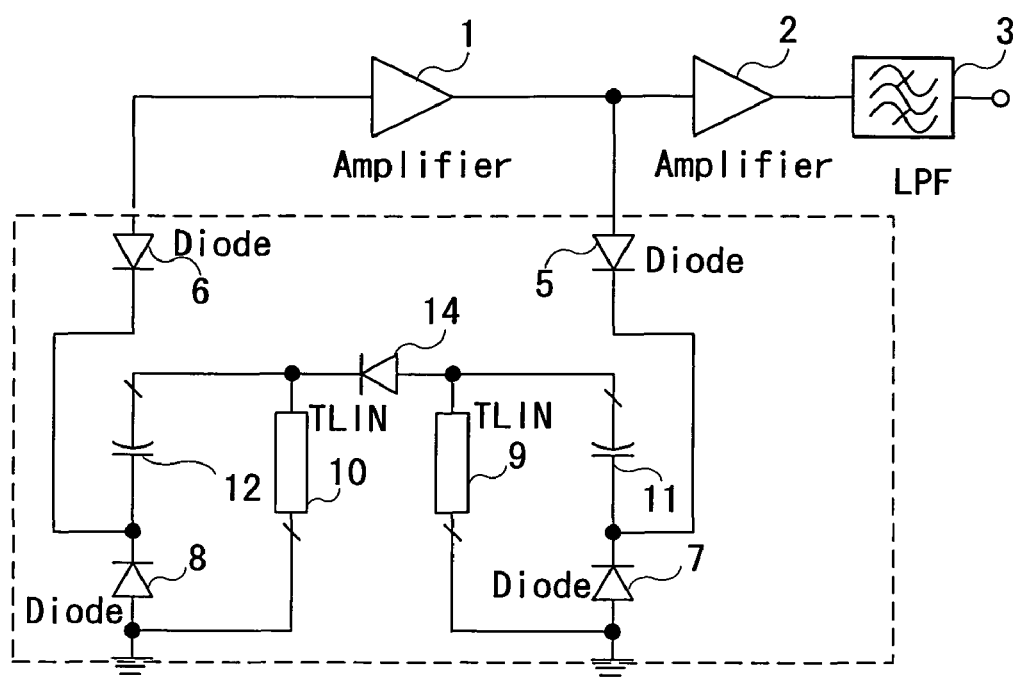
FIG. 14 It is a configuration diagram of a specific circuit of the third circuit.

[Specific Third Circuit: FIG. 14]

Referring now to FIG. 14, a specific circuit of the third circuit will be described. FIG. 14 is a configuration diagram of a specific circuit of the third circuit.

The specific circuit of the third circuit is basically the same as the circuit illustrated in FIG. 13 but differs in that a capacitive reactance element 11 is connected in series between a capacitive variable reactance element 5 and a capacitive variable reactance element 14 and a capacitive reactance element 12 is connected in series between the capacitive variable reactance element 14 and a capacitive variable reactance element 6.

The capacitive reactance elements 11 and 12 are composed of capacitors (C).

One end of an inductive reactance element 9 is connected to a point between the capacitive reactance element 11 and the capacitive variable reactance element 14, and the other end of the inductive reactance element 9 is grounded.

One end of an inductive reactance element 10 is connected to a point between the capacitive reactance element 12 and the capacitive variable reactance element 14, and the other end of the inductive reactance element 10 is grounded.

The cathode of the diode of the capacitive variable reactance element 7 is connected to a point between the capacitive reactance element 11 and the capacitive variable reactance element 5, and the anode thereof is grounded.

The cathode of the diode of the capacitive variable reactance element 8 is connected to a point between the capacitive reactance element 12 and the capacitive variable reactance element 6, and the anode thereof is grounded.

Figure 15:
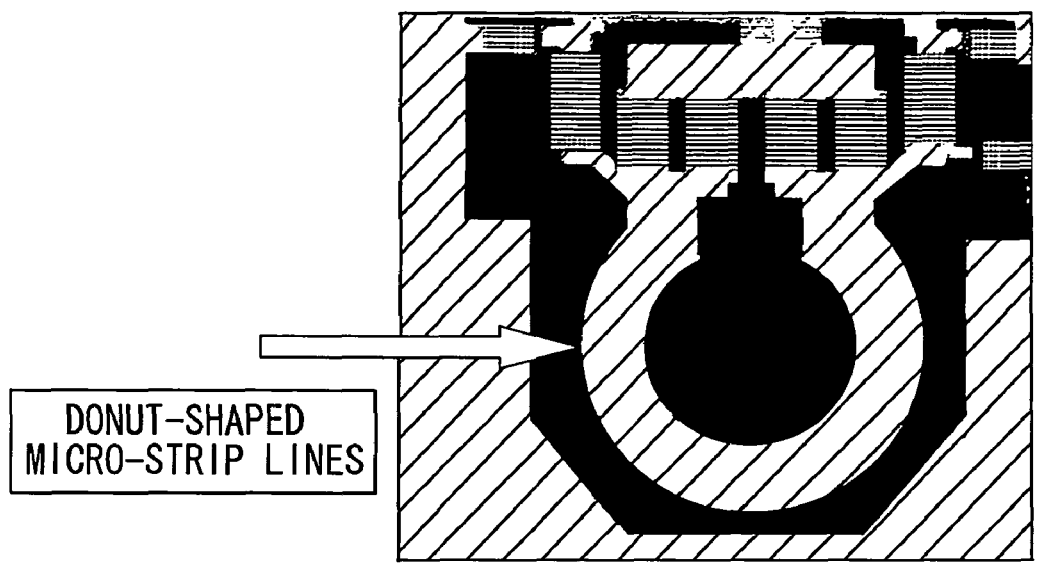
FIG. 15 It is a diagram illustrating a first configuration example of an inductive reactance element.
Figure 16:
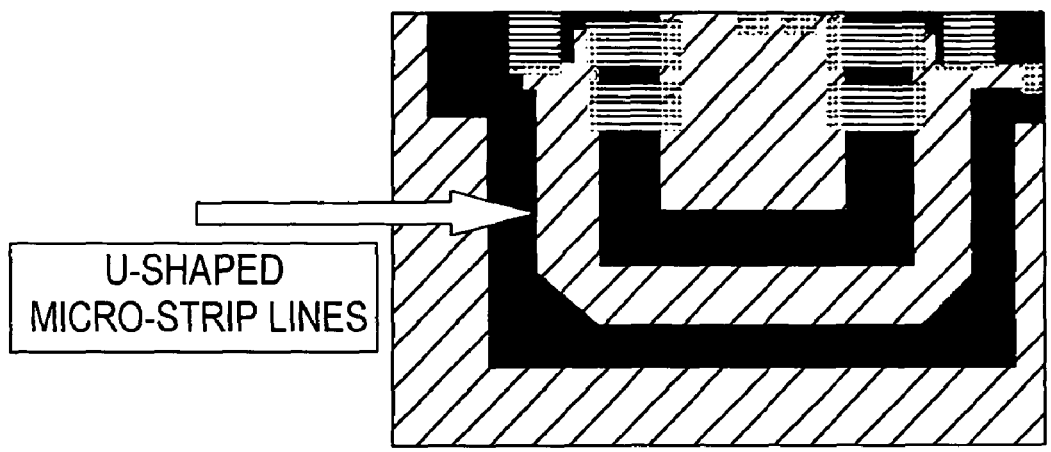
FIG. 16 It is a diagram illustrating a second configuration example of an inductive reactance element.

[Specific Configurations of the Inductive Reactance Elements 4, 9 and 10: FIG. 15 and FIG. 16]

Specific first and second configuration examples (first and second configuration examples) of the inductive reactance element 4 of the first circuit and the inductive reactance elements 9 and 10 of the second and the third circuits will now be described with reference to FIG. 15 and FIG. 16. FIG. 15 is a diagram illustrating a first configuration example of the inductive reactance element, and FIG. 16 is a diagram illustrating a second configuration example of the inductive reactance element.

In the first configuration example of the inductive reactance element 4, the micro-strip lines are formed into a donut shape, as illustrated in FIG. 15. In the second configuration example of the inductive reactance element 4, the micro-strip lines are formed into a U shape bent at 45 degree, as illustrated in FIG. 16.

Figure 17:
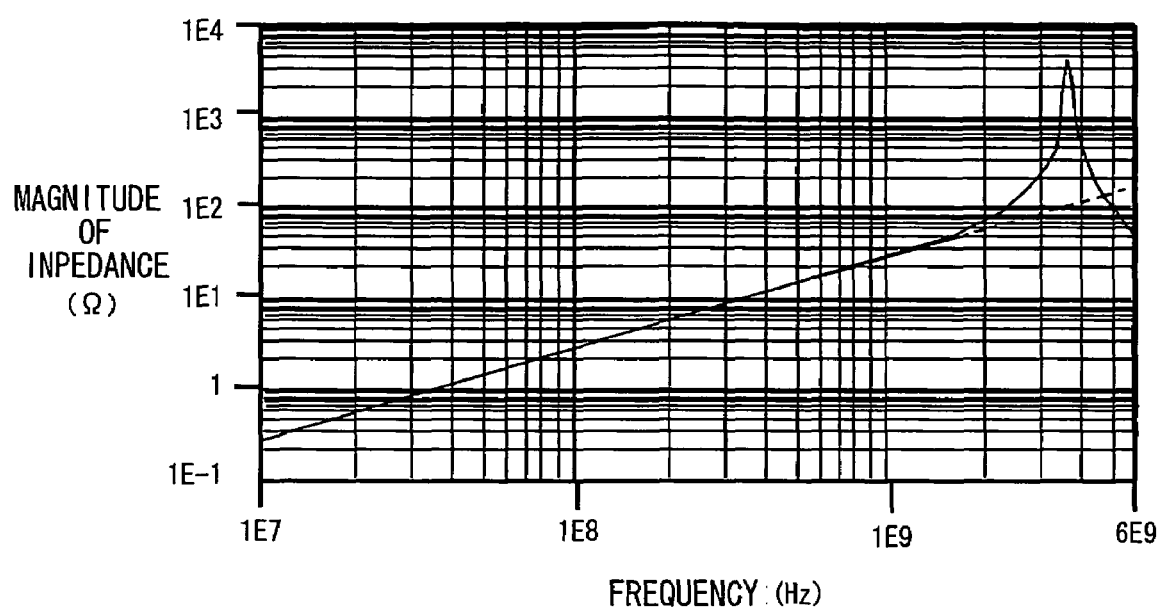
FIG. 17 It is a diagram illustrating the magnitudes of typical impedances of the micro-strip lines shown in the first and the second configuration examples.
Figure 18:
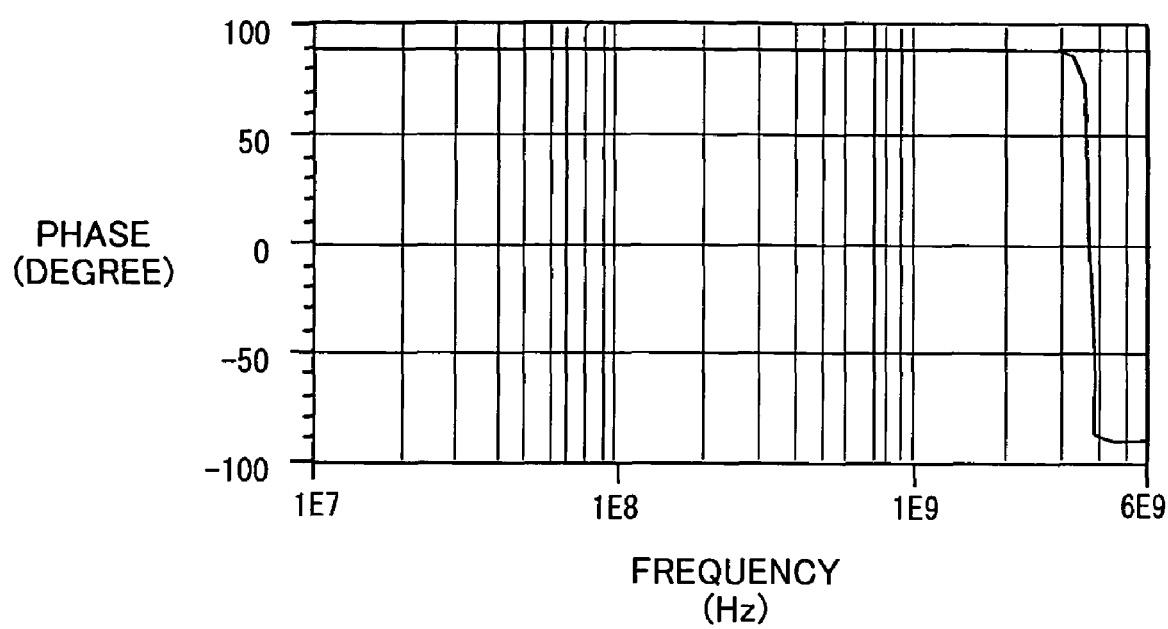
FIG. 18 It is a diagram illustrating the phases of typical impedances of micro-strip lines shown in the first and the second configuration examples.

[Characteristics of Micro-Strip Lines: FIG. 17 and FIG. 18]

The characteristics of the micro-strip lines will now be described with reference to FIG. 17 and FIG. 18. FIG. 17 is a diagram illustrating typical impedance magnitudes of the micro-strip lines shown in the first and the second configuration examples described above, and FIG. 18 is a diagram illustrating typical impedance phases of the micro-strip lines shown in the first and the second configuration examples described above. In FIG. 17, the axis of abscissas indicates frequencies, while the axis of ordinates indicates the magnitudes of impedances. In FIG. 18, the axis of abscissas indicates frequencies, while the axis of ordinates indicates phases.

The solid lines shown in FIG. 17 and FIG. 18 denote the impedance characteristic in the present circuit, while the dashed lines denote the impedance characteristic of an ideal inductor.

The present circuit is characterized in that the micro-strip lines equivalently function as an inductor at an oscillating frequency.

Figure 19:
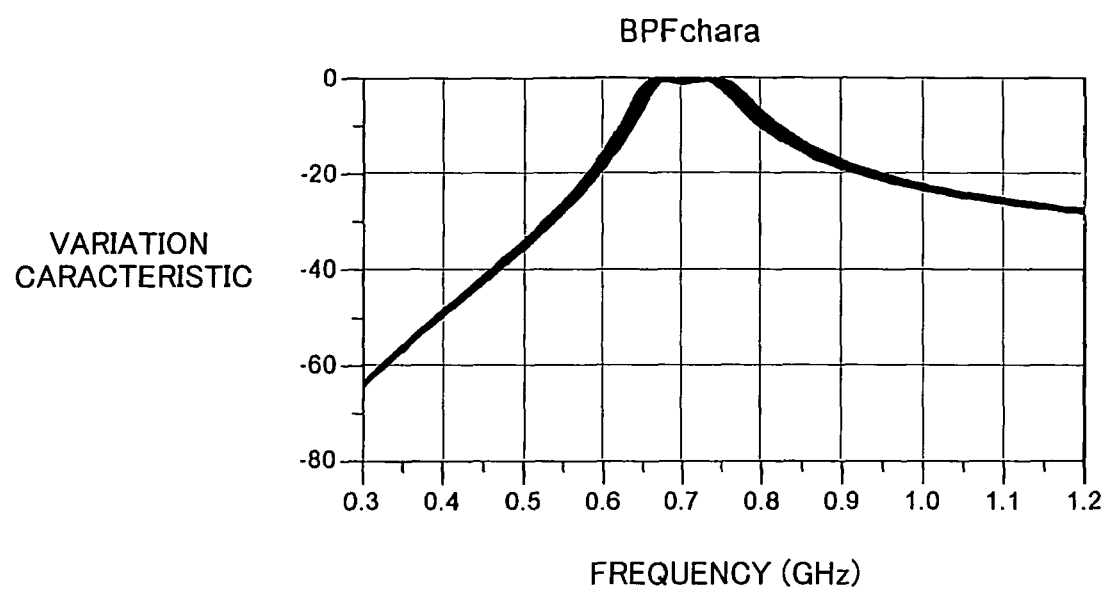
FIG. 19 It is a diagram illustrating the variation characteristic of the double-tuned circuits of the second to the fifth circuits.
Figure 20:
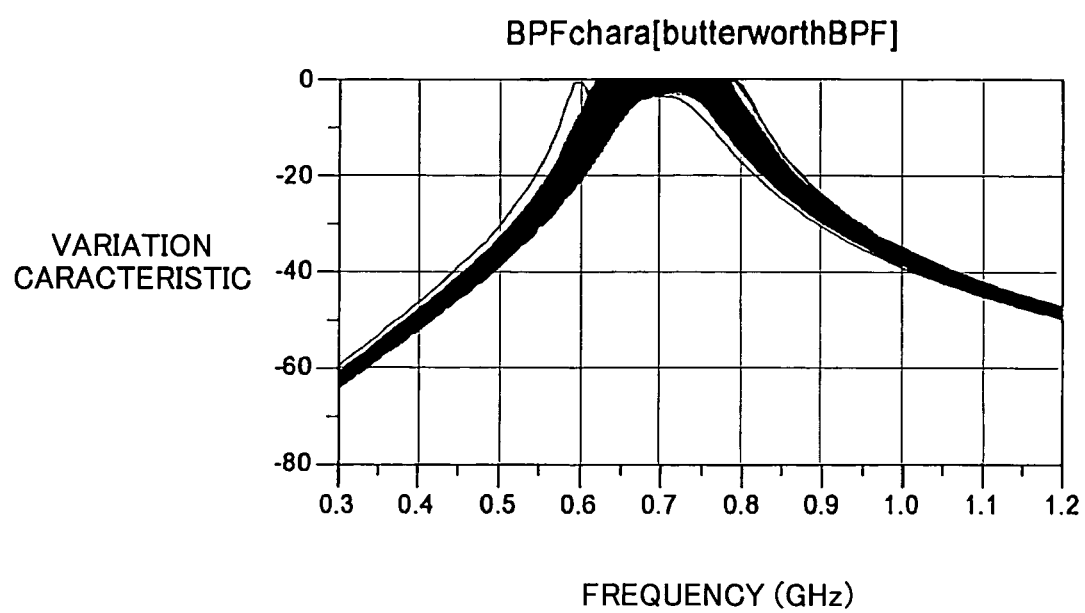
FIG. 20 It is a diagram illustrating the variation characteristic of a Butterworth band-pass filter.

[Variation Characteristic of the Double-Tuned Circuit: FIG. 19 and FIG. 20]

The variation characteristic of the double-tuned circuit of the second to the fifth embodiments of the present invention will now be described with reference to FIG. 19 and FIG. 20. FIG. 19 is a diagram illustrating the variation characteristic of the double-tuned circuit of the second to the fifth circuits, and FIG. 20 is a diagram illustrating the variation characteristic of a Butterworth band-pass filter. In FIG. 19 and FIG. 20, the axis of abscissas indicates frequencies and the axis of ordinates indicates the variation characteristic (dB).

As compared with the variation characteristic of the Butterworth band-pass filter shown in FIG. 20, the variation characteristic of the double-tuned circuit in FIG. 19 is better. Less variations in the filter characteristic lead to less variations in the phase of a filter which provides a factor for determining an oscillating frequency.

Figure 21:
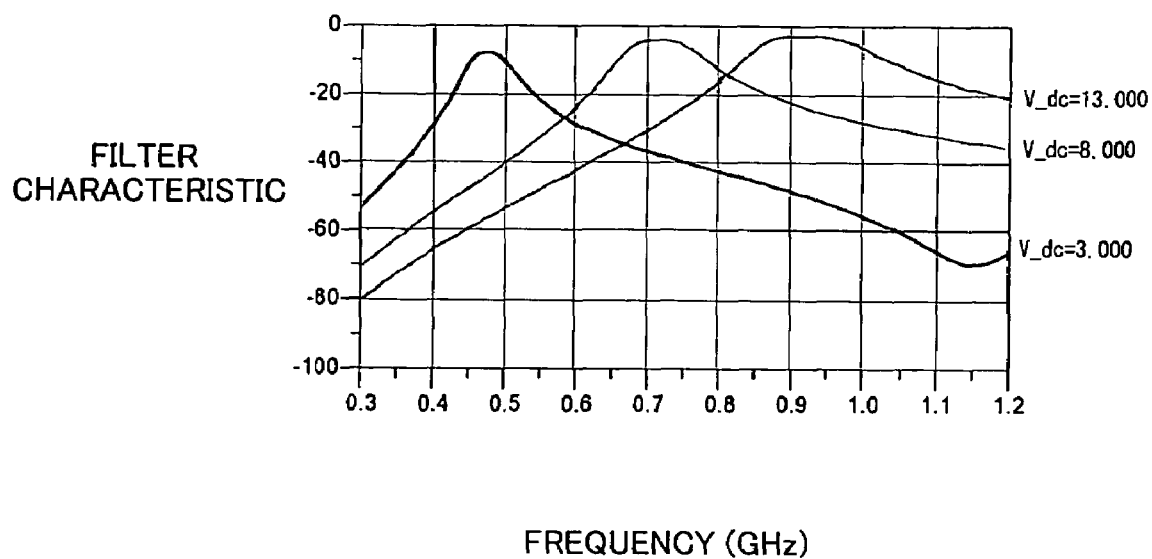
FIG. 21 It is a diagram illustrating the filter characteristic adjusted by changing a varicap diode.
Figure 22:
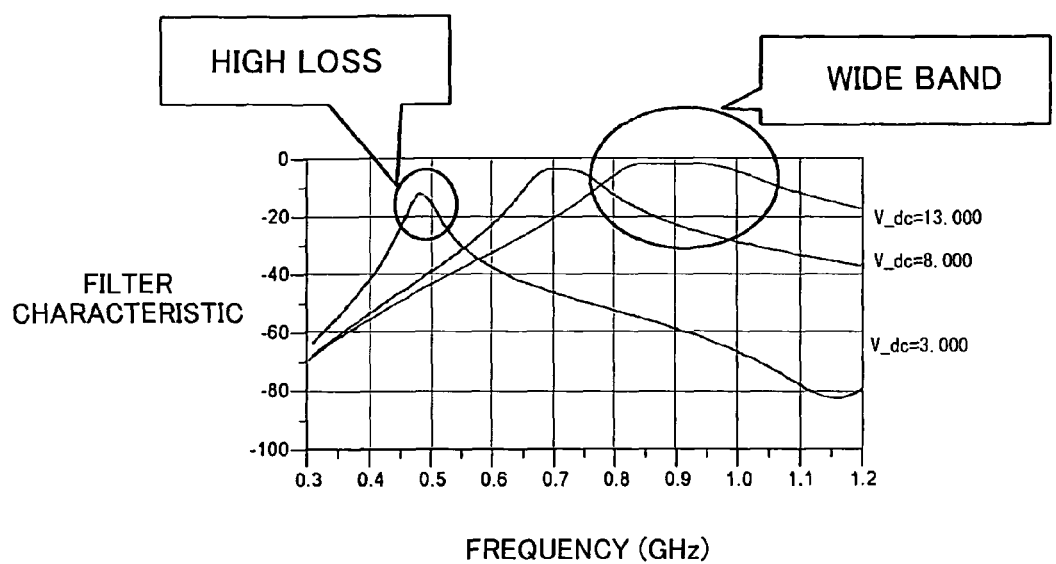
FIG. 22 It is a diagram illustrating the filter characteristic of a fixed diode.

[Application of the Capacitive Variable Reactance Elements: FIG. 21 and FIG. 22]

The advantageous effect of the capacitive variable reactance elements will now be described with reference to FIG. 21 and FIG. 22. FIG. 21 is a diagram illustrating filter characteristics adjusted by changing the capacitive variable reactance elements, and FIG. 22 is a diagram illustrating filter characteristics obtained by applying fixed capacitors to D1, D2 and D3 in FIG. 5.

FIG. 22 illustrates the filter characteristics obtained by using fixed capacitors for D1, D2 and D3 in FIG. 5 and by setting the capacitance of the varicap diodes D4 and D5 to three different conditions. FIG. 21 illustrates the filter characteristics obtained by setting the capacitance of the D1 to D5 in FIG. 5 to three different conditions.

It is seen that, as compared with FIG. 21, the filter characteristics in FIG. 22 significantly change under the three conditions. Especially in FIG. 22, a high loss and a wider band are shown.

If the filter characteristics significantly change as described above, then when the oscillating frequency is changed, the loss or the phase change amount of the filter varies undesirably. This leads to a marked change in phase noise, making it impossible to apply the product to a system, such as a synthesizer.

[Advantageous Effects of the Embodiments]

According to the first circuit, a feedback loop of an oscillating amplifier circuit includes a phase shifting circuit having an odd number of π low-pass filter of filters of a third order or more and capacitive variable reactance elements connected in series to an input end and an output end of the low-pass filter, and the low-pass filter includes an inductive reactance element connected in series with the feedback loop, and a capacitive variable reactance element connected in parallel to an input end and an output end of the inductive reactance element. This arrangement advantageously achieves a circuit which makes it possible to select a frequency to be used by controlling the capacitances of the capacitive variable reactance elements of the low-pass filter and also to attenuate the gain of a low frequency by controlling the capacitances of the capacitive variable reactance elements connected in series with the feedback loop so as to provide a characteristic similar to that of a band-pass filter, to restrain abnormal oscillations, to improve phase noise, and to permit easier adjustment by a simple configuration.

Further, according to the second circuit, the feedback loop of the oscillating amplifier circuit includes a phase shifting circuit which has a double-tuned circuit having a plurality of parallel resonance circuits of capacitive variable reactance elements D and inductive reactance elements L, and capacitive variable reactance elements D1 and D2 connected in series with the input end and the output end of the double-tuned circuit, and the double-tuned circuit connects the plurality of parallel resonance circuits by capacitive variable reactance elements D3, D4 and D5. This arrangement advantageously makes it possible to select a frequency to be used by controlling the capacitance of the capacitive variable reactance element D3 of the double-tuned circuit and also to set an optimum amount of coupling with the oscillating amplifier circuit by controlling the capacitances of the capacitive variable reactance elements D1 and D2 connected in series to the feedback loop. This advantageously makes it possible to provide the phase shifting circuit with a characteristic of a variable band-pass filter, to restrain abnormal oscillations, and to improve phase noise.

Further, the third circuit is based on the first circuit and includes the capacitive reactance elements C1 and C2 connected in series between the capacitive variable reactance element D3 connected in series in the double-tuned circuit and the capacitive variable reactance elements D1 and D2 connected in series to the input and the output thereof, thus advantageously making it possible to permit adjustment available with a band-pass filter, to restrain abnormal oscillations, and to improve phase noise.

Further, according to the fourth circuit based on the second circuit, the capacitive reactance elements C3 and C4 are connected in series to the input and the output of the double-tuned circuit instead of connecting the capacitive variable reactance elements D1 and D2 in series, and the capacitive variable reactance elements D6 and D7, in place of the capacitive reactance elements C1 and C2, are connected in series between the capacitive reactance elements C3 and C4 and the capacitive variable reactance element D3 connected in series. Thus, the fourth circuit advantageously makes it possible to permit adjustment available with a band-pass filter, to restrain abnormal oscillations, and to improve phase noise.

Further, according to the fifth circuit based on the first circuit, in place of the capacitive variable reactance element D3 for the capacitive coupling in the double-tuned circuit, the inductive reactance elements L1 and L2 are disposed to face each other to accomplish coupling by a magnetic field. Thus, the fifth circuit advantageously makes it possible to permit adjustment available with a band-pass filter, to restrain abnormal oscillations, and to improve phase noise.

Further, according to the first to the fifth circuits, the inductive reactance elements are constituted of micro-strip lines, which are formed into a horseshoe shape, a donut shape, or a U shape bent at 45 degrees, thus advantageously making it possible to reduce the size of the module without causing phase noise to worsen.

The present invention is ideal for a high-frequency voltage-controlled oscillation circuit capable of restraining abnormal oscillations, improving phase noise, and reducing the size of the circuit.

What is claimed is:

1. A high-frequency voltage-controlled oscillation circuit, comprising:
   an oscillating amplifier circuit,
   wherein a feedback loop of the oscillating amplifier circuit includes a phase shifting circuit having a π low-pass filter of third or higher odd order, a first diode of a capacitive variable reactance element connected in series with an output end of the low-pass filter, and a second diode of a capacitive variable reactance element connected in series with the input end of the low-pass filter, and the low-pass filter includes a coil of an inductive reactance element connected in series with the feedback loop, a fourth diode of the capacitive variable reactance element connected in parallel with the output end of the inductive reactance element, and a fifth diode of the capacitive variable reactance element connected in parallel to the input end of the inductive reactance element.

2. The high-frequency voltage-controlled oscillation circuit according to claim 1,
wherein the first diode and the second diode are varicap diodes.

3. The high-frequency voltage-controlled oscillation circuit according to claim 1,
wherein the fourth diode and the fifth diode are varicap diodes.

4. The high-frequency voltage-controlled oscillation circuit according to claim 1,
wherein the inductive reactance element in the low-pass filter is formed of a micro-strip line.

5. The high-frequency voltage-controlled oscillation circuit according to claim 2, wherein the inductive reactance element in the low-pass filter is formed of a micro-strip line.

6. The high-frequency voltage-controlled oscillation circuit according to claim 3,
wherein the inductive reactance element in the low-pass filter is formed of a micro-strip line.

7. The high-frequency voltage-controlled oscillation circuit according to claim 4,
wherein the micro-strip line has a horseshoe shape, a donut shape, or a U shape bent at 45 degrees.

8. The high-frequency voltage-controlled oscillation circuit according to claim 5,
wherein the micro-strip line has a horseshoe shape, a donut shape, or a U shape bent at 45 degrees.

9. The high-frequency voltage-controlled oscillation circuit according to claim 6,
wherein the micro-strip line has a horseshoe shape, a donut shape, or a U shape bent at 45 degrees.

10. A high-frequency voltage-controlled oscillation circuit comprising:
an oscillating amplifier circuit,
wherein a phase shifting circuit is provided in a feedback loop for feeding an output back to an input of the oscillating amplifier circuit,
the phase shifting circuit includes:
a first diode serving as a capacitive variable reactance element connected in series with an output end of the feedback loop,
a second diode serving as a capacitive variable reactance element connected in series with an input end of the feedback loop,
a third diode serving as a capacitive variable reactance element connected in series with the feedback loop between the first diode and the second diode, and
a double-tuned circuit having a first parallel resonance circuit provided in the feedback loop connecting the first diode and the third diode, and a second parallel resonance circuit provided in the feedback loop connecting the second diode and the third diode,
the first parallel resonance circuit has a fourth diode serving as a capacitive variable reactance element and a first coil serving as an inductive reactance element, and
the second parallel resonance circuit has a fifth diode serving as a capacitive variable reactance element and a second coil serving as an inductive reactance element.

11. The high-frequency voltage-controlled oscillation circuit according to claim 10,
wherein a first capacitor serving as a capacitive reactance element is connected in series between the first diode serving as a capacitive reactance element connected in series to an output end of the double-tuned circuit and the third diode serving as a capacitive variable reactance element in the double-tuned circuit, and a second capacitor serving as a capacitive reactance element is connected in series between the third diode serving as a capacitive variable reactance element in the double-tuned circuit and the second diode serving as a capacitive reactance element connected in series with an input end of the double-tuned circuit, while a first coil serving as an inductive reactance element is connected with one end of the first capacitor, a second coil serving as an inductive reactance element is connected with one end of the second capacitor, and the fourth diode serving as a capacitive variable reactance element is connected with the other end of the first capacitor, and the fifth diode serving as a capacitive variable reactance element is connected with the other end of the second capacitor.

12. The high-frequency voltage-controlled oscillation circuit according to claim 10,
wherein the inductive reactance elements in the double-tuned circuit are formed of micro-strip lines.

13. The high-frequency voltage-controlled oscillation circuit according to claim 11,
wherein the inductive reactance elements in the double-tuned circuit are formed of micro-strip lines.

14. The high-frequency voltage-controlled oscillation circuit according to claim 12,
wherein the micro-strip lines have a horseshoe shape, a donut shape, or a U shape bent at 45 degrees.

15. The high-frequency voltage-controlled oscillation circuit according to claim 13,
wherein the micro-strip lines have a horseshoe shape, a donut shape, or a U shape bent at 45 degrees.

* * * * *